United States Patent
Wei et al.

(10) Patent No.: US 9,577,662 B2
(45) Date of Patent: Feb. 21, 2017

(54) METHOD AND APPARATUS FOR EXCESS LOOP DELAY COMPENSATION IN CONTINUOUS-TIME SIGMA-DELTA ANALOG-TO-DIGITAL CONVERTERS

(71) Applicant: Broadcom Corporation, Irvine, CA (US)

(72) Inventors: Guowen Wei, San Jose, CA (US); Xinyu Yu, San Jose, CA (US); Michael Inerfield, Sunnyvale, CA (US); Tom Kwan, Cupertino, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 14/954,532

(22) Filed: Nov. 30, 2015

(65) Prior Publication Data

US 2016/0233872 A1    Aug. 11, 2016

Related U.S. Application Data

(60) Provisional application No. 62/250,164, filed on Nov. 3, 2015, provisional application No. 62/113,273, filed on Feb. 6, 2015.

(51) Int. Cl.
| | | |
|---|---|---|
| *H03M 1/06* | (2006.01) | |
| *H03M 3/00* | (2006.01) | |
| *H03M 1/12* | (2006.01) | |
| *H03M 1/00* | (2006.01) | |
| *H03M 1/14* | (2006.01) | |
| *H03M 1/46* | (2006.01) | |
| *H03M 1/80* | (2006.01) | |

(52) U.S. Cl.
CPC .............. *H03M 3/37* (2013.01); *H03M 1/00* (2013.01); *H03M 1/0695* (2013.01); *H03M 1/12* (2013.01); *H03M 1/144* (2013.01); *H03M 1/466* (2013.01); *H03M 1/804* (2013.01); *H03M 3/426* (2013.01)

(58) Field of Classification Search
CPC ........ H03M 1/00; H03M 1/12; H03M 1/0695; H03M 1/804
USPC ........ 341/118, 155, 156, 158, 161, 120, 172
See application file for complete search history.

(56) References Cited

U.S. PATENT DOCUMENTS

2014/0085122 A1* 3/2014 Jeon .................... H03M 1/0678
341/158

* cited by examiner

*Primary Examiner* — Joseph Lauture
(74) *Attorney, Agent, or Firm* — Sterne, Kessler, Goldstein & Fox P.L.L.C.

(57) ABSTRACT

A CT-SDADC of the present disclosure converts the analog input signal from a representation in an analog signal domain to a representation in a digital signal domain to provide the digital output signal. The CT-SDADC achieves the analog-to-digital conversion and ELDC by switching between two phases in the SAR sub-ADC: a sampling phase and a conversion phase. During the sampling phase, the SAR sub-ADC captures the analog input signal across multiple arrays of switchable capacitors. The conversion phase comprises a number of steps, and one or more bits of the digital output signal are resolved at each step of the conversion phase. A portion of the SC-DAC is driven by the delayed CT-SDADC output during the conversion phase to effectively compensate for excess loop delay caused by the CT-SDADC feedback loop.

20 Claims, 4 Drawing Sheets

METHOD AND APPARATUS FOR EXCESS LOOP DELAY COMPENSATION IN CONTINUOUS-TIME SIGMA-DELTA ANALOG-TO-DIGITAL CONVERTERS

CROSS-REFERENCE TO RELATED APPLICATIONS

The present application claims the benefit of U.S. Provisional Patent Appl. No. 62/250,164, filed Nov. 3, 2015, and U.S. Provisional Patent Appl. No. 62/113,273, filed Feb. 6, 2015, both of which are incorporated herein by reference in their entirety.

BACKGROUND

Field

The present disclosure relates generally to analog-to-digital converters (ADCs) and including excess loop delay compensation in sigma-delta ADCs.

Related Art

Sigma-delta modulation is a method for encoding an analog input signal into a digital output signal. A sigma-delta analog-to-digital converter (ADC) encodes the analog input signal using a high-frequency sigma-delta modulation, and then filters the encoded input signal to form a higher-resolution but lower sample-frequency digital output. The first step in a sigma-delta modulation is delta modulation of the analog input signal. In delta modulation, a change in the analog input signal, namely a delta, is encoded to provide the digital output signal. The accuracy of the delta modulation is improved by passing the digital output signal through a digital-to-analog converter (DAC) and combining the resulting analog signal, namely the sigma, to the analog input signal forming a feedback loop with forward gain to reduce errors introduced by the coarse sub-ADC.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

Generally, the drawing in which an element first appears is typically indicated by the leftmost digit(s) in the corresponding reference number. In the accompanying drawings.

DETAILED DESCRIPTION OF EMBODIMENTS

Overview

Sigma-delta analog-to-digital converters (ADCs) include a continuous-time sigma-delta analog-to-digital converter (CT-SDADC) or a discrete-time sigma-delta analog-to-digital converter (DT-SDADC). The CT-SDADC and the DT-SDADC include loop filters to distribute quantization noise or error, produced by the CT-SDADC and the DT-SDADC when converting the analog input signal, to higher frequencies. The DT-SDADC samples the analog input signal prior to the loop filter whereas the sampling of the analog input signal occurs after the loop filter in the CT-SDADC. This allows the loop filter of the CT-SDADC to be implemented using continuous time integrators rather than switchable capacitor integrators of the DT-SDADC. The continuous time integrators do not possess the same stringent settling and slew requirements of the switchable capacitor integrators which leads to lower power consumption in the CT-SDADC.

The CT-SDADC delta modulates a change in the analog input signal to provide the digital output signal. Thereafter, the CT-SDADC feeds back the digital output signal through a digital-to-analog converter (DAC) and combines the resulting analog signal, namely the sigma, to the analog input signal. This feedback mechanism combined with gain in the loop-filter essentially causes an average of this resulting analog signal to be approximately equal to the analog input signal which reduces errors introduced by the encoding. However, the feedback mechanism can introduce excess loop delay into the CT-SDADC. The excess loop delay degrades performance and can cause instability, and therefore excess loop delay compensation (ELDC) is warranted to mitigate the negative effects of the excess loop delay.

A CT-SDADC of the present disclosure converts the analog input signal from a representation in an analog signal domain to a representation in a digital signal domain to provide the digital output signal. The CT-SDADC achieves the analog-to-digital conversion and ELDC by switching between two phases: a sampling phase and a conversion phase. During the sampling phase, the CT-SDADC captures the analog input signal across multiple arrays of switchable capacitors. The conversion phase comprises a number of steps, and one or more bits of the digital output signal are resolved at each step of the conversion phase. Each step of the conversion phase effectively compensates for excess loop delay contribution caused by the feedback of the CT-SDADC.

Figure 1:
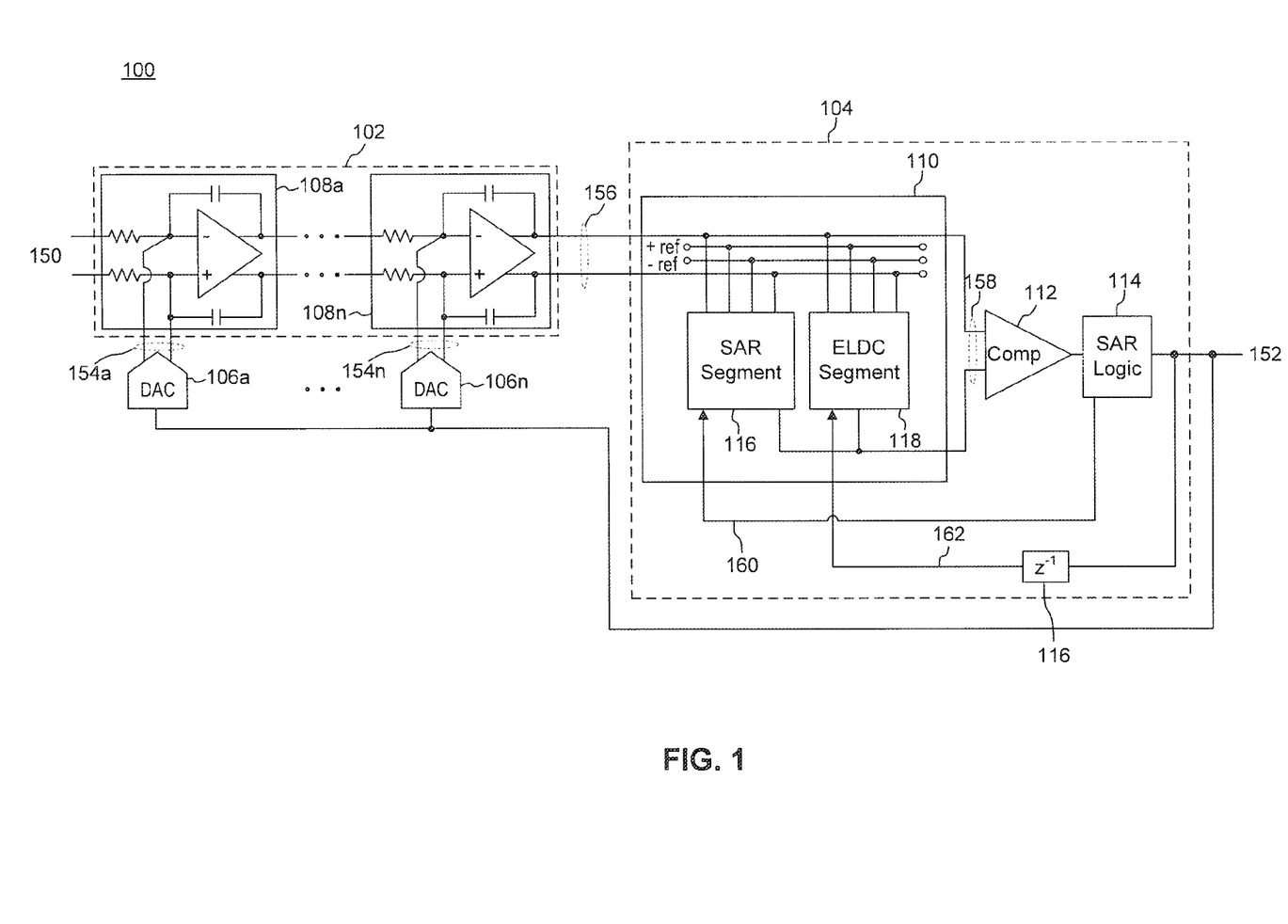
FIG. 1 illustrates a block diagram of an exemplary embodiment of a CT-SDADC employing a sub-ADC with excess loop delay compensation (ELDC) according to an exemplary embodiment of the present disclosure.

Exemplary Continuous-Time Sigma-Delta Analog-to-Digital Converter (CT-SDADC) with Excess Loop Delay Compensation FIG. 1 illustrates a block diagram of an exemplary embodiment of a CT-SDADC employing a sub-ADC with excess loop delay compensation (ELDC) according to an exemplary embodiment of the present disclosure. As illustrated in FIG. 1, the CT-SDADC 100 converts an analog input signal 150 from a representation in an analog signal domain to a representation in a digital signal domain to provide a digital output signal 152. In an exemplary embodiment, the analog input signal 150 represents a differential analog signal. However, those skilled in the relevant art(s) can readily modify the CT-SDADC 100 to operate on a single ended analog signal without departing from the spirit and scope of the present disclosure. The CT-SDADC 100 includes a loop filter 102, a sub-ADC 104, and feedback DACs 106a through 106n.

The loop filter 102 represents an $n^{th}$ order filter having n filtering stages 108a through 108n. The n filtering stages can be implemented using any suitable continuous time integrators, such as those illustrated in FIG. 1, that will be apparent to those skilled in the relevant art(s) without departing from the spirit and scope of the present disclosure. Each filtering stage from among the filtering stages 108a through 108n combines a corresponding analog representation from among analog representations 154a through 154n of the digital output signal 152 with its corresponding input and filters this resulting analog signal to provide a filtered analog signal for a subsequent filtering stage from among the filtering stages 108a through 108n. However, as illustrated in FIG. 1, the filtering stage 108a combines the analog input signal 150 with the analog representation 154a of the digital output signal 152 and the filtering stage 108n provides its corresponding filtered analog signal as a filtered analog input signal 156.

The sub-ADC 104 converts the filtered analog input signal 156 from a representation in the analog signal domain to a representation in the digital signal domain to provide the digital output signal 152. As illustrated in FIG. 1, the sub-ADC 104 can be implemented as a successive approximation register analog-to-digital converter (SAR ADC). The sub-ADC 104 achieves the analog-to-digital conversion and ELDC by switching between two phases: a sampling phase and a conversion phase. During the sampling phase, the sub-ADC 104 captures the filtered analog input signal 156 across multiple arrays of switchable capacitors. The conversion phase comprises a number of steps, and one or more bits of the digital output signal 152 are resolved at each step of the conversion phase. The sub-ADC 104 includes a switched-capacitor DAC (SC-DAC) 110, a comparator 112, SAR logic 114, and a delay element 116.

The SC-DAC 110 provides a difference between the filtered analog input signal 156 and a reference voltage, denoted as +ref, −ref in FIG. 1, using the multiple arrays of switchable capacitors. The phases of the sub-ADC 104 dictate the operation of the multiple arrays of switchable capacitors. When the sub-ADC 104 is operating in the sampling phase, the multiple arrays of switchable capacitors in the SC-DAC 110 are switched to capture one or more samples of the filtered analog input signal 156. Otherwise, the SC-DAC 110 provides a sampled analog signal 158 including a discrete representation of the filtered analog input signal 156 subtracted from the analog representation of the current and previous SAR digital outputs. Signal 158 is generated by successively switching the multiple arrays of switchable capacitors in response to a SAR conversion code 160 and/or an ELDC code 162 when the sub-ADC 104 is operating in the conversion phase.

The SC-DAC 110 includes a SAR segment 116 and an ELDC segment 118. The SAR segment 116 can be any type of SC-DAC configured for successive approximation using a first array of switchable capacitors from among the multiple arrays of switchable capacitors that will be apparent to those skilled in the relevant art(s) without departing from the spirit and scope of the present disclosure. The first array of switchable capacitors is configured by the SAR conversion code 160. The SAR conversion code 160 is to be described in further detail below. The ELDC segment 118 compensates for excess loop delay introduced into the filtered analog input signal 156 by feedback of the digital output signal 152 to the loop filter 102 as shown in FIG. 1. By using very small capacitors (e.g., on the order of femtoFarads) in the ELDC segment 118, the ELDC power consumption is much lower than previous designs. Furthermore, such a design has a negligible impact on the loop delay, since it does not require an additional clock cycle and the track-and-hold bandwidth can be easily made very wide.

When the sub-ADC 104 is operating in the sampling phase, the ELDC segment 118 captures the filtered analog input signal 156 across a second array of switchable capacitors from among the multiple arrays of switched capacitors. When the sub-ADC 104 is operating in the conversion phase, the second array of switchable capacitors of the ELDC segment 118 switch based on the ELDC code 162. The ELDC code 162 is a delayed version of the digital output signal 152. This switching of the second array of switchable capacitors can affect the sampled analog input signal 158 by adjusting the sampled analog input signal 158 based on a previous value of the digital output signal 152 to compensate for the excess loop delay. For example, if a previous step of the conversion phase resulted in a value of the digital output signal 152 of two, or, in binary '010,' the ELDC code 162 for a following step of the conversion phase is two. In an exemplary embodiment, the second array of switchable capacitors includes three switchable capacitors having increasing capacitance with a first capacitor from among the three switchable capacitors having a largest capacitance and a third capacitor from among the three switchable capacitors having a smallest capacitance. In this exemplary embodiment, the ELDC code 162 causes the first and third capacitors to switch to the reference voltage +ref, and a second capacitor from among the three switchable capacitors to switch to the reference voltage −ref. Such a configuration would effectively subtract the excess loop delay contribution from the filtered analog input signal 156, which is caused by the feedback of the previous value of the digital output signal 152 into the loop filter 102.

The comparator 112, when the sub-ADC 104 is operating in the conversion phase, compares the sampled analog input signal 158 with ground to determine a polarity of the sampled analog input signal 158. Thereafter, the comparator 112 provides a logic one (or logic zero) indicating that the sampled analog input signal 158 is positive (or negative). However, when the sub-ADC 104 is operating in the sampling phase, the operation of the comparator 118 is ignored.

The SAR logic 114 controls the switching operation of the SC-DAC 110 based upon the polarity of the sampled analog input signal 158 and outputs the digital output signal 152 based on the output from comparator 112. In an exemplary embodiment, the digital output signal 152 is in a parallel format. As discussed above, the SAR logic 114 controls the first array of switchable capacitors of the SAR segment 116 via the SAR conversion code 160. When the sub-ADC 104 is operating in the sampling phase, the SAR conversion code 160 configures the first array of switchable capacitors to capture a sample of the filtered analog input signal 156. When the sub-ADC 104 is operating in a first step of the conversion phase, the SAR conversion code 160 switches the first array of switchable capacitors to ground to pass the filtered analog input signal 156 captured by the first array of switchable capacitors during the sampling phase onto the comparator 112 to determine the polarity of the filtered analog input signal 156. The number of steps of the conversion phase depends upon the number of bits, or resolution, of the digital output signal 152. For example, a digital output signal 152 having a three-bit resolution necessitates three steps for the conversion phase, each step of the conversion phase determining one of the three bits. At each successive step of the conversion phase, the SAR conversion code 160 configures the first array of switchable capacitors based upon the polarity of the sampled analog input signal 158 to resolve successive bits of the digital output signal 152. In an exemplary embodiment, if the comparison is positive, then the SAR conversion code 160 for the next step of the conversion phase configures a largest capacitor, not previously switched, from among the first array of switchable capacitors to be switched to the reference voltage −ref. In another exemplary embodiment, if the comparison is negative, then the SAR conversion code 160 for the next step of the conversion phase configures the largest capacitor not previously switched to be switched to the reference voltage +ref. Each subsequent step of the conversion phase results in the switching of a successively smaller capacitor to either the reference voltage +ref or reference voltage −ref. For example, if the first step of the conversion phase resolves that the sampled analog input signal 158 is positive, then the second step may switch the largest capacitor not previously switched in a manner as to subtract ref/2 volts from the sampled analog input signal 158. In this example, comparing the sampled analog input signal 158 to ground using the comparator 112 effectively resolves whether the filtered analog input signal 156 is greater than or less than ref/2 volts and results in a second bit of resolution for the digital output signal 152.

The delay element 116 delays the digital output signal 152 by one or more clock cycles to provide the ELDC code 162.

The feedback DACs 150a-150n convert the digital output signal 152 from a representation in the digital signal domain to a representation in the analog signal domain to provide the analog representations 154a through 154n of the digital output signal 152.

Exemplary SC-DAC that can be Implemented as Part of the CT-SDADC

Figure 2:
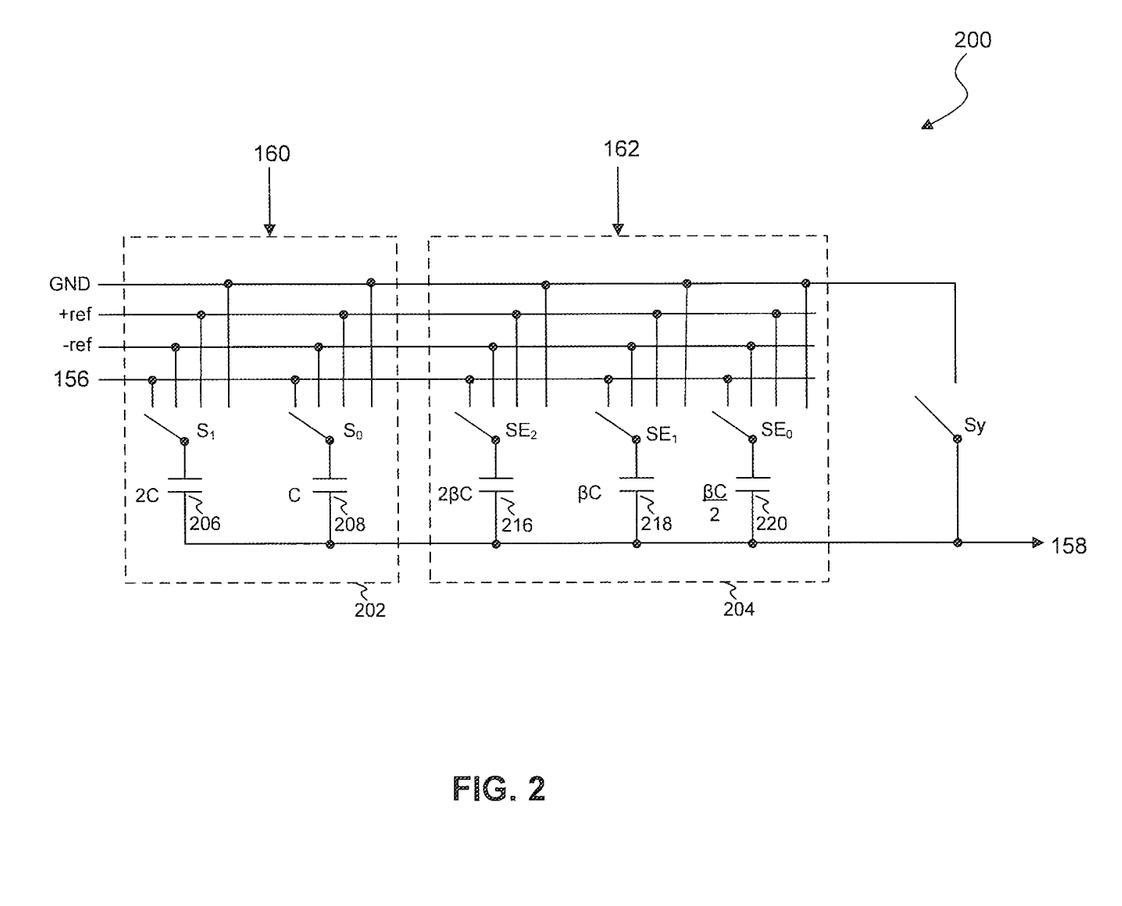
FIG. 2 is a schematic diagram of an exemplary embodiment of a SC-DAC with ELDC according to an exemplary embodiment of the present disclosure.

FIG. 2 is a schematic diagram of an exemplary embodiment of a SC-DAC with ELDC according to an exemplary embodiment of the present disclosure. Although the SC-DAC of FIG. 2 is illustrated as being a single-ended SC-DAC with ELDC, those skilled in the relevant art(s) can readily modify the SC-DAC to be implemented as a differential SC-DAC with ELDC without departing from the spirit and scope of the present disclosure. The SC-DAC 200 includes multiple arrays of switchable capacitors that are used by a CT-SDADC, such as the CT-SDADC 100 to provide an example, to sample an analog input signal, such as the filtered analog input signal 156, to provide a sampled analog input signal, such as the sampled analog input signal 158 to provide an example and for ELDC. As illustrated in FIG. 2, the SC-DAC 200 includes a SAR segment 202 and an ELDC segment 204. The SC-DAC 200 can represent an exemplary embodiment of the SC-DAC 110. As such the SAR segment 202 and the ELDC segment 204 can represent exemplary embodiments of the SAR segment 116 and the ELDC segment 118.

The SAR segment 202 includes a first array of switchable capacitors from among the multiple arrays of switchable capacitors. As illustrated in FIG. 2, the SAR segment 202 includes switchable capacitors 206 through 208 with capacitance 2C and C, respectively; however, the SAR segment 202 can include any suitable number of switchable capacitors as will be recognized by those skilled in the relevant art(s) without departing from the spirit and scope of the present disclosure. The SAR segment 202 also includes a first group of switching elements such as switches $S_1$ and $S_0$ as illustrated in FIG. 2; however, the SAR segment 202 can include any suitable number of switching elements within the first group of switching elements as will be recognized by those skilled in the relevant art(s) without departing from the spirit and scope of the present disclosure. Each of the first group of switching elements, such as the switches $S_1$ and $S_0$, selectively couples it corresponding switchable capacitor, such as the switchable capacitor 206 or the switchable capacitor 208, to one of a ground, the reference voltage +ref, the reference voltage −ref, or the filtered analog input signal 156 in response to the SAR conversion code 160.

The ELDC segment 204 includes a second array of switchable capacitors from among the multiple arrays of switchable capacitors. As illustrated in FIG. 2, the ELDC segment 204 includes switchable capacitors 216 through 220 with capacitance $2\rho C$, $\beta C$, and $\beta C/2$, respectively; however, the ELDC segment 204 can include any suitable number of switchable capacitors as will be recognized by those skilled in the relevant art(s) without departing from the spirit and scope of the present disclosure. The ELDC segment 204 also includes a second group of switching elements, such as switches $SE_2$ through $SE_0$ as illustrated in FIG. 2; however, the ELDC segment 204 can include any suitable number of switching elements within the second group of switching elements as will be recognized by those skilled in the relevant art(s) without departing from the spirit and scope of the present disclosure. Each of the second group of switching elements, such as the switches $SE_2$ through $SE_0$, selectively couples its corresponding switchable capacitor, such as the switchable capacitor 216, the switchable capacitor 218, or the switchable capacitor 220, to one of a ground, the reference voltage +ref, the reference voltage −ref, or the filtered analog input signal 156 in response to the ELDC code 162.

In an exemplary embodiment, the SC-DAC 200 can be implemented as part of a sub-ADC of a CT-SDADC, such as the sub-ADC 104 of the CT-SDADC 100 to provide an example. In this exemplary embodiment, the sub-ADC achieves analog-to-digital conversion and ELDC by switching between two phases: a sampling phase and a conversion phase. As illustrated in FIG. 2, the sub-ADC enters into the sampling phase by closing a common terminal switch $S_y$ to couple the filtered analog input signal 156 to ground. During the sampling phase, the SAR conversion code 160 configures the switches $S_1$ and $S_0$ to couple the switchable capacitors 206 through 208 to the filtered analog input signal 156 and the ELDC code 162 configures the switches $SE_2$ through $SE_0$ to couple the switchable capacitors 216 through 220 to the filtered analog input signal 156. Because the common terminal switch $S_y$ is connected to the ground, the filtered analog input signal 156 is essentially grounded in the sampling phase. This allows the SAR segment 202 and the ELDC segment 204 to capture a sample of the filtered analog input signal 156 by charging the switchable capacitors 206 through 208 and the switchable capacitors 216 through 220 with the filtered analog input signal 156.

As illustrated in FIG. 2, the sub-ADC enters into the conversion phase by opening the common terminal switch $S_y$ to decouple the filtered analog input signal 156 from the ground. The conversion phase includes multiple steps with the number of steps of the conversion phase corresponding to the number of bits, or resolution of a digital output signal of the CT-SDADC, such as the digital output signal 152 to provide an example. For example, for a three bit digital output signal, the conversion phase includes three steps, with the configuration of each of the switches $S_1$, $S_0$, $SE_2$, $SE_1$, $SE_0$, and $S_y$ being illustrated in TABLE 1 below:

|  | Switch Position | | | | | |
| --- | --- | --- | --- | --- | --- | --- |
| Phase | $S_1$ | $S_0$ | $S_{E2}$ | $S_{E1}$ | $S_{E0}$ | $S_y$ |
| Sampling | Input | Input | Input | Input | Input | ON |
| Conversion Step 1 | GND | GND | Dependent on previous data | | | OFF |
| Conversion Step 2 | Data dependent | | | | | OFF |
| Conversion Step 3 | Data dependent | | | | | OFF |

During a first step of the three-bit conversion phase, the switchable capacitors 206 through 208 of the SAR segment 202 are switched to the ground and switching of the switchable capacitors 216 through 220 of the ELDC segment 204 is dependent upon a previous value of the digital output signal. For example, if the previous value of the digital output signal resulted in a value of the digital output signal of two, or, in binary '010,' the switchable capacitors 216 and 220 would be switched to the reference voltage +ref, and the switchable capacitors 218 would be switched to ground. Any capacitor in the ELDC segment 204 that is switched to one of the reference voltage +ref or the reference voltage −ref is configured to be in series with the switchable capacitors 206 through 208 that have not yet been switched from the ground, and the sampled analog input signal 158 will depend on the relative capacitance of the various capacitors. For example, if the switchable capacitors 216 and 218 are connected to ground, while the switchable capacitors 220 is connected to the reference voltage +ref, then the sampled analog input signal 158 would be $V_o = -V_{in} + (\beta V_{ref})/(6+7\beta)$ where $V_{ref} = +\text{ref}$. The sampled analog input signal 158 is thus independent of the capacitance C, but depends on ELDC coefficient $\beta$ as well as the reference voltage $V_{ref}$. The term $(\beta V_{ref})/(6+7\beta)$ approximates the error caused by excess loop delay. If the ELDC segment switches $SE_2$ through $SE_0$ are controlled based on the previous value of the digital output signal, and the ELDC segment capacitors 216 through 220 are properly sized, this redistribution of charge subtracts a scaled and quantized version of the previous input from the present input, effectively compensating for the excess loop delay contribution to the filtered analog input signal 156. During the second and the third steps of the three-bit conversion phase, the switchable capacitors 206 through 208 of the SAR segment 202 are switched to +ref or −ref in response to the SAR code, as previously described, and the switchable capacitors 216 through 220 of the ELDC segment 204 are not switched since the previous value of the digital output signal is constant over the conversion phase.

In some embodiments, the ELDC code 162 controls the ELDC segment switches $SE_2$ through $SE_0$ according to TABLE 2 below. In TABLE 2, the ELDC code 162 corresponds to the previous digital data output signal of a 3-bit CT-SDADC.

|  | Switch Position | | |
| --- | --- | --- | --- |
| ELDC Code | $S_{E2}$ | $S_{E1}$ | $S_{E0}$ |
| 3 | +ref | +ref | +ref |
| 2 | +ref | GND | +ref |
| 1 | GND | +ref | +ref |
| 0 | GND | GND | +ref |
| −1 | GND | GND | −ref |
| −2 | GND | −ref | −ref |
| −3 | −ref | GND | −ref |
| −2 | −ref | −ref | −ref |

After all of the steps of the conversion phase have been completed, the sub-ADC once again enters into the sampling phase by closing the common terminal switch $S_y$ to couple the filtered analog input signal 156 to the ground to capture another sample of the filtered analog input signal 156.

Figure 3:
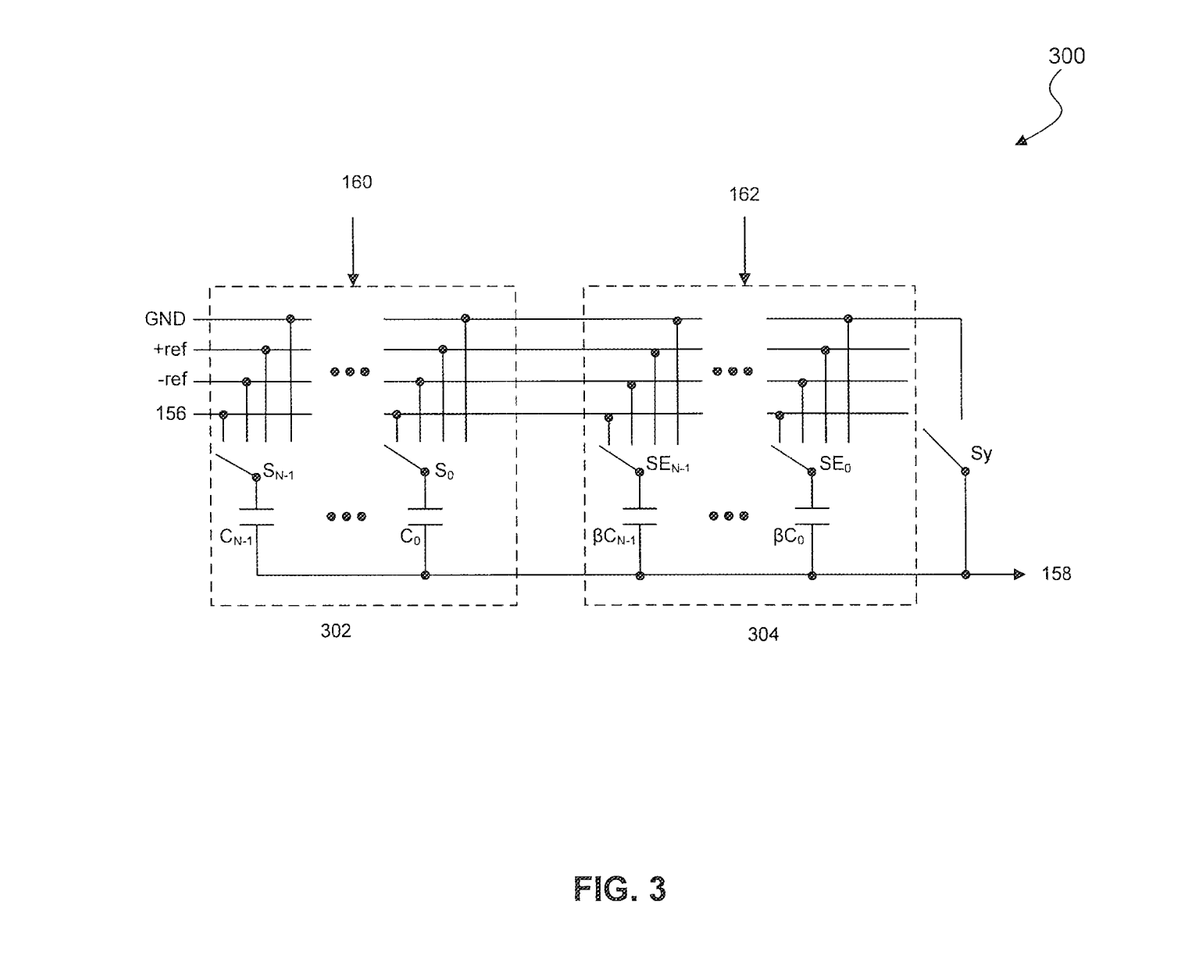
FIG. 3 is a schematic diagram of a second exemplary embodiment of a SC-DAC with ELDC according to an exemplary embodiment of the present disclosure.

FIG. 3 is a schematic diagram of a second exemplary embodiment of a SC-DAC with ELDC according to an exemplary embodiment of the present disclosure. The SC-DAC 300 includes multiple arrays of switchable capacitors that is used by a CT-SDADC, such as the CT-SDADC 100 to provide an example, to sample an analog input signal, such as the filtered analog input signal 156, to provide a sampled analog input signal, such as the sampled analog input signal 158 to provide an example and for ELDC. As illustrated in FIG. 3, the SC-DAC 300 includes a SAR segment 303 and an ELDC segment 304. The SC-DAC 300 can represent an exemplary embodiment of the SC-DAC 110. As such the SAR segment 303 and the ELDC segment 304 can represent exemplary embodiments of the SAR segment 116 and the ELDC segment 118.

The SC-DAC 300 operates in a substantially similar manner as the SC-DAC 200; therefore, only differences between the SC-DAC 200 and SC-DAC 300 are to be described in further detail. The SAR segment 302 includes a first array of switchable capacitors from among the multiple arrays of switchable capacitors. As illustrated in FIG. 3, the SAR segment 302 includes switchable capacitors $C_{N-1}$ through $C_0$. The SAR segment 302 also includes a first group of switching elements such as switches $S_{N-1}$ through $S_0$. Each of the switches $S_{N-1}$ through $S_0$ selectively couples its corresponding switchable capacitor $C_{N-1}$ through $C_0$ to one of a ground, the reference voltage +ref, the reference voltage −ref, or the filtered analog input signal 156 in response to the SAR conversion code 160.

The ELDC segment 304 includes a second array of switchable capacitors from among the multiple arrays of switchable capacitors. As illustrated in FIG. 3, the ELDC segment 304 includes switchable capacitors $\beta C_{N-1}$ through $\beta C_0$. The ELDC segment 304 also includes a second group of switching elements such as switches $SE_{N-1}$ through $SE_0$. Each of switches $SE_{N-1}$ through $SE_0$ selectively couples its corresponding switchable capacitor $\beta C_{N-1}$ through $\beta C_0$ to one of a ground, the reference voltage +ref, the reference voltage −ref, or the filtered analog input signal 156 in response to the ELDC code 162.

Exemplary Operation of the CT-SDADC with Excess Loop Delay Compensation (ELDC)

Figure 4:
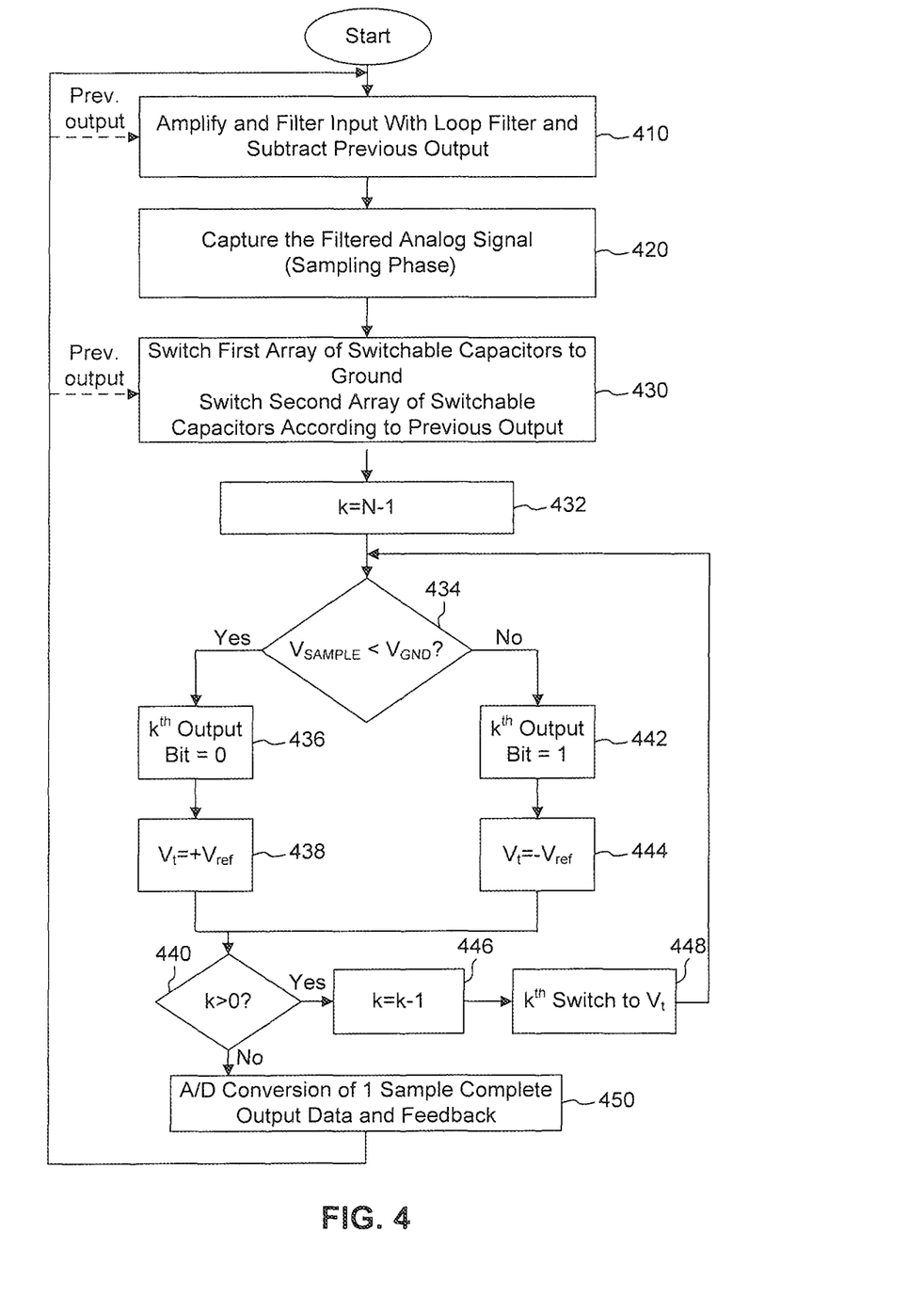
FIG. 4 represents a flowchart of an exemplary embodiment of a method of ELDC in a CT-SDADC according to an exemplary embodiment of the present disclosure.

FIG. 4 represents a flowchart of an exemplary embodiment of a method of ELDC in a CT-SDADC according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow of a CT-SDADC, such as the CT-SDADC 100 to provide an example.

At step 410, the exemplary operational control flow combines an analog input signal, such as an analog input signal 150 to provide an example, with an analog representation of a previous value of a digital output signal, such as the digital output signal 152 to provide an example. The exemplary operational control flow filters and amplifies the combined analog signal to provide a filtered analog input signal, such as the filtered analog input signal 156 to provide an example, to provide a sampled analog input signal, such as the sampled analog input signal 158 to provide an example.

At step 420, the exemplary operational control flow enters into a sampling phase mode of operation. The exemplary operational control flow configures multiple arrays of switchable capacitors to capture the filtered analog input signal of step 410 in the sampling phase mode of operation. For example, the exemplary operational control flow configures a first array of switchable capacitors and a second array of switchable capacitors from among the multiple arrays of switchable capacitors to capture a sample of the filtered analog input signal of step 410.

At step 430, the exemplary operational control flow enters into a conversion phase mode of operation. The exemplary operational control flow configures the first array of switchable capacitors to ground and the second array of switchable capacitors to various states based on the previous value of the digital output signal. For example, if the previous value of the digital output signal is two, or, in binary '010,' the exemplary operational control flow couples a first and a third switchable capacitor from among the second array of switchable capacitors to a reference voltage +ref and a second switchable capacitor from among the second array of switchable capacitors to the ground.

At step 432, the exemplary operational control flow initializes a count to N−1, where N represents the number of bits, or resolution, of the digital output signal.

At step 434, the exemplary operational control flow compares the sampled analog input signal of step 420 to ground. When the sampled analog input signal of step 420 is greater than ground, the exemplary operational control flow proceeds to step 436. Otherwise the exemplary operational control flow proceeds to step 442 when sampled analog input signal of step 420 is less than or equal to ground.

At step 436, the exemplary operational control flow assigns the $k^{th}$ bit of the digital output signal to be a logical zero.

At step 438, the exemplary operational control flow assigns a temporary variable Vt to equal reference voltage +ref. The temporary variable can be used in step 448 to switch capacitors in the first switchable array of switchable capacitors in subsequent steps of the conversion phase. The temporary variable can represent the SAR code 160 to provide an example.

At step 440, the exemplary operational control flow determines whether the conversion phase has completed, for example by comparing a counter to zero. If the conversion phase has completed, for example if the counter is equal to zero, then the exemplary operational control flow proceeds to step 450. Otherwise, the exemplary operational control flow proceeds to step 446.

At step 442, the exemplary operational control flow assigns the $k^{th}$ bit of the digital output signal to be a logical one.

At step 444, the exemplary operational control flow assigns a temporary variable Vt to equal reference voltage −ref. The temporary variable can be used in step 448 to switch capacitors in the first switchable array of switchable capacitors in subsequent steps of the conversion phase. The temporary variable can represent the SAR code 160 to provide an example.

At step 446, the exemplary operational control flow decrements the counter k to enter the next step of the conversion phase.

At step 448, the exemplary operational control flow couples the $k^{th}$ switch from among the first array of switchable capacitors to the reference voltage represented by the temporary variable assigned in either step 438 or 444. The exemplary operational control flow then proceeds back to step 434.

At step 450, the exemplary operational control flow outputs the all N bits of the output that were assigned in step 436 or step 442 at each step of the conversion phase, feeds back this data to reuse in steps 410 and 430, and proceeds to step 410 to begin conversion of a new sample.

CONCLUSION

The following Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. An analog-to-digital converter (ADC) for converting an analog input signal from a representation in an analog signal domain to a representation in a digital signal domain to provide a digital output signal, comprising:
   a successive approximation register (SAR) segment, including a first array of switchable capacitors from among a plurality of switchable capacitors, the plurality of switchable capacitors being configured to capture one or more samples of the analog input signal during a sampling phase, each switchable capacitor from among the first array of switchable capacitors being configured to switch between a first reference voltage and a second reference voltage based upon a polarity of the one or more samples of the analog input signal during a conversion phase;
   an excess loop delay compensation (ELDC) segment including a second array of switchable capacitors from among the plurality of switchable capacitors, each switchable capacitor from among the second array of switchable capacitors being configured to switch between the first reference voltage and the second reference voltage based upon a previous value of the digital output signal to provide a discrete representation of the analog input signal during the conversion phase; and
   a comparator configured to convert the discrete representation of the analog input signal to the digital signal domain to provide the digital output signal.

2. The ADC of claim 1, wherein the conversion phase comprises a plurality of steps, each step from among the plurality of steps being associated with a bit of resolution of the digital output signal,
   wherein the first array of switchable capacitors is configured to be switched to provide a first bit of resolution of the digital output signal during a first step from among the plurality of steps, and
   wherein a first switchable capacitor from among the first array of switchable capacitors is configured to be switched between the first reference voltage and the second reference voltage based upon the polarity of the one or more samples of the analog input signal to determine a second bit of resolution of the digital output signal during a second step from among the plurality of steps.

3. The ADC of claim 2, wherein a second switchable capacitor from among the first array of switchable capacitors is configured to be switched between the first reference voltage and the second reference voltage based upon the polarity of the one or more samples of the analog input signal to determine a third bit of resolution of the digital output signal during a third step from among the plurality of steps.

4. The ADC of claim 1, wherein the second array of switchable capacitors is configured to capture the one or more samples of the analog input signal during the sampling phase.

5. The ADC of claim 1, wherein each switchable capacitor from among the second array of switchable capacitors corresponds to a bit of resolution of a previous value of the digital output signal and is configured to switch to the first reference voltage when its corresponding bit of resolution is at a first logical level or to the second reference voltage when its corresponding bit of resolution is at a second logical level.

6. The ADC of claim 1, wherein the comparator is further configured to determine a polarity of the discrete representation of the analog input signal during the conversion phase.

7. The ADC of claim 1, further comprising:
   a common terminal configured to:
      couple the plurality of switchable capacitors to ground to capture the one or more samples of the analog input signal during the sampling phase, and
      decouple the plurality of switchable capacitors from the ground during the conversion phase.

8. A method for converting an analog input signal from a representation in an analog signal domain to a representation in a digital signal domain to provide a digital output signal, comprising:
   capturing, by a plurality of switchable capacitors, one or more samples of the analog input signal during a sampling phase;
   switching each switchable capacitor from among a first array of switchable capacitors of the plurality of switchable capacitors between a first reference voltage and a second reference voltage based upon a polarity of the one or more samples of the analog input signal during a conversion phase;
   before switching each switchable capacitor from among the first array of switchable capacitors during the conversion phase, switching each switchable capacitor from among a second array of switchable capacitors of the plurality of switchable capacitors between the first reference voltage and the second reference voltage based upon a previous value of the digital output signal during the conversion phase to provide a discrete representation of the analog input signal during the conversion phase; and
   converting the discrete representation of the analog input signal to the digital signal domain to provide the digital output signal.

9. The method of claim 8, wherein the conversion phase comprises a plurality of steps, each step from among the plurality of steps being associated with a bit of resolution of the digital output signal,
   wherein switching each switchable capacitor from among the first array of switchable capacitors comprises:
      switching the first array of switchable capacitors to provide a first bit of resolution of the digital output signal during a first step from among the plurality of steps;
      switching a first switchable capacitor from among the first array of switchable capacitors between the first reference voltage and the second reference voltage based upon the polarity of the one or more samples of the analog input signal to determine a second bit of resolution of the digital output signal during a second step from among the plurality of steps.

10. The method of claim 9, wherein switching each switchable capacitor from among the first array of switchable capacitors comprises:
   switching a second switchable capacitor from among the first array of switchable capacitors between the first reference voltage and the second reference voltage based upon the polarity of the one or more samples of the analog input signal to determine a third bit of resolution of the digital output signal during a third step from among the plurality of steps.

11. The method of claim 8, further comprising:
   switching the second array of switchable capacitors to capture the one or more samples of the analog input signal during the sampling phase.

12. The method of claim 8, wherein each switchable capacitor from among the second array of switchable capacitors corresponds to a bit of resolution of a previous value of the digital output signal, and wherein switching each switchable capacitor from among the second array of switchable capacitors comprises:
switching each switchable capacitor from among the second array of switchable capacitors to the first reference voltage when its corresponding bit of resolution is at a first logical level or to the second reference voltage when its corresponding bit of resolution is at a second logical level.

13. The method of claim 8, wherein the converting comprises:
determining the polarity of the discrete representation of the analog input signal during the conversion phase.

14. The method of claim 8, further comprising:
coupling the plurality of switchable capacitors to ground to capture the one or more samples of the analog input signal during the sampling phase, and
decoupling the plurality of switchable capacitors from the ground during the conversion phase.

15. A continuous-time sigma-delta analog-to-digital converter (CT-SDADC) for converting an analog input signal from a representation in an analog signal domain to a representation in a digital signal domain to provide a digital output signal, comprising:
a loop filter having a plurality of stages, configured to provide a filtered analog input signal based upon the analog input signal, each stage from among the plurality of stages being configured to combine a corresponding analog representation from among a plurality of analog representations of the digital output signal with its corresponding input and to filter the combined corresponding analog representation;
a plurality of feedback digital-to-analog converters (DACs) configured to convert the digital output signal from a representation in the digital signal domain to a representation in the analog signal domain to provide the plurality of analog representations of the digital output signal,
a successive approximation register (SAR) segment, including a first array of switchable capacitors from among a plurality of switchable capacitors, the plurality of switchable capacitors being configured to capture one or more samples of the filtered analog input signal during a sampling phase, each switchable capacitor from among the first array of switchable capacitors being configured to switch between a first reference voltage and a second reference voltage based upon a polarity of the one or more samples of the filtered analog input signal during a conversion phase;
an excess loop delay compensation (ELDC) segment including a second array of switchable capacitors from among the plurality of switchable capacitors, each switchable capacitor from among the second array of switchable capacitors being configured to switch between the first reference voltage and the second reference voltage based upon a previous value of the digital output signal to compensate for ELDC of the loop filter to provide a discrete representation of the filtered analog input signal during the conversion phase; and
a comparator configured to convert the discrete representation of the filtered analog input signal to the digital signal domain to provide the digital output signal.

16. The CT-SDADC of claim 15, wherein the conversion phase comprises a plurality of steps, each step from among the plurality of steps being associated with a bit of resolution of the digital output signal,
wherein the first array of switchable capacitors is configured to be switched to provide a first bit of resolution of the digital output signal during a first step from among the plurality of steps; and
wherein a first switchable capacitor from among the first array of switchable capacitors is configured to be switched between the first reference voltage and the second reference voltage based upon the polarity of the one or more samples of the filtered analog input signal to determine a second bit of resolution of the digital output signal during a second step from among the plurality of steps.

17. The CT-SDADC of claim 16, wherein a second switchable capacitor from among the first array of switchable capacitors is configured to be switched between the first reference voltage and the second reference voltage based upon the polarity of the one or more samples of the filtered analog input signal to determine a third bit of resolution of the digital output signal during a third step from among the plurality of steps.

18. The CT-SDADC of claim 15, wherein the second array of switchable capacitors is configured to capture the one or more samples of the filtered analog input signal during the sampling phase.

19. The CT-SDADC of claim 15, wherein each switchable capacitor from among the second array of switchable capacitors corresponds to a bit of resolution of a previous value of the digital output signal and is configured to switch to the first reference voltage when its corresponding bit of resolution is at a first logical level or to the second reference voltage when its corresponding bit of resolution is at a second logical level.

20. The CT-SDADC of claim 15, wherein the comparator is further configured to determine a polarity of the discrete representation of the filtered analog input signal during the conversion phase.

* * * * *